(12) United States Patent
Uyeno

(10) Patent No.: US 10,722,845 B1
(45) Date of Patent: Jul. 28, 2020

(54) ISOTOPE ENRICHMENT FOR IMPROVED MAGNETIC MATERIALS

(75) Inventor: Gerald P. Uyeno, Tucson, AZ (US)

(73) Assignee: RAYTHEON COMPANY, Waltham, MA (US)

(*) Notice: Subject to any disclaimer, the term of this patent is extended or adjusted under 35 U.S.C. 154(b) by 2727 days.

(21) Appl. No.: 13/562,795

(22) Filed: Jul. 31, 2012

(51) Int. Cl.
| | |
|---|---|
| B01D 59/00 | (2006.01) |
| G21F 1/08 | (2006.01) |
| H05K 9/00 | (2006.01) |
| B64G 1/54 | (2006.01) |
| G12B 17/02 | (2006.01) |
| H01F 1/00 | (2006.01) |
| H01F 1/03 | (2006.01) |

(52) U.S. Cl.
CPC ............ *B01D 59/00* (2013.01); *B64G 1/546* (2013.01); *G12B 17/02* (2013.01); *G21F 1/08* (2013.01); *H01F 1/00* (2013.01); *H01F 1/0018* (2013.01); *H01F 1/03* (2013.01); *H05K 9/00* (2013.01)

(58) Field of Classification Search
CPC ..... B01D 59/44; B01D 59/00; G01F 1/56–60; C01P 2006/88; B01J 19/087; G12B 17/02; B64G 1/546; H05K 9/00; G21F 1/08; H01F 1/00; H01F 1/0018; H01F 1/03
USPC ........ 204/157.2–157.22; 244/171.7; 148/101
See application file for complete search history.

(56) References Cited

U.S. PATENT DOCUMENTS

| | | | | |
|---|---|---|---|---|
| 3,239,333 A | * | 3/1966 | McCarthy | C22C 5/06 420/469 |
| 3,540,945 A | * | 11/1970 | Hoffer | H01F 1/055 420/435 |
| 3,955,858 A | * | 5/1976 | Poubeau | B64G 1/283 310/90.5 |
| 4,723,735 A | * | 2/1988 | Eisenhaure | B64G 1/283 244/165 |
| 5,514,477 A | * | 5/1996 | Ohashi | H01F 10/14 428/457 |
| 5,948,214 A | * | 9/1999 | Bailey | B01D 59/34 204/157.2 |
| 5,965,829 A | * | 10/1999 | Haynes | G21F 1/08 420/528 |
| 6,730,538 B1 | * | 5/2004 | Meek | H01L 21/31604 438/104 |

(Continued)

FOREIGN PATENT DOCUMENTS

| | | | |
|---|---|---|---|
| CN | 101328018 A | * 12/2008 | |
| JP | 02086814 A | * 3/1990 | |
| JP | 04119905 A | * 4/1992 | ......... H01L 39/2464 |

OTHER PUBLICATIONS

Koehler et al, "Magnetic Structures of Samarium," Phys. Rev. Lett. vol. 29 No. 21, pp. 1468-1472, Nov. 28, 1972 (Year: 1972).*

(Continued)

*Primary Examiner* — Nicholas A Smith
*Assistant Examiner* — Colleen M Raphael
(74) *Attorney, Agent, or Firm* — Cantor Colburn LLP

(57) ABSTRACT

A method for producing a magnetic material includes: selecting a mixture of isotopes of a chemical element having a desired magnetic characteristic; identifying an isotope in the mixture of isotopes meeting a selection criterion; removing the identified isotope from the mixture of isotopes using an isotope separation device to produce an enriched mixture of isotopes having a decreased concentration of the identified isotope; wherein the enriched mixture of isotopes is the magnetic material.

25 Claims, 6 Drawing Sheets

(56) References Cited

U.S. PATENT DOCUMENTS

| | | | |
|---|---|---|---|
| 2002/0127384 A1* | 9/2002 | Mulligan | B29C 48/30 428/293.7 |
| 2002/0185614 A1* | 12/2002 | Joseph | G21F 1/103 250/507.1 |
| 2005/0192364 A1* | 9/2005 | Lichtenhan | C23C 18/1212 521/50 |
| 2006/0102464 A1* | 5/2006 | Tillotson | B01D 59/00 204/157.2 |
| 2007/0010390 A1* | 1/2007 | Margaryan | C03B 5/08 501/45 |
| 2007/0272557 A1* | 11/2007 | Matthews | C25B 15/02 205/46 |
| 2008/0249275 A1* | 10/2008 | Lichtenhan | C23C 18/1212 528/9 |
| 2012/0108044 A1* | 5/2012 | Kaim | C01B 35/00 438/514 |
| 2013/0174731 A1* | 7/2013 | Raizen | B01D 59/44 95/28 |
| 2015/0248941 A1* | 9/2015 | Thibeault | G21F 1/10 252/478 |

OTHER PUBLICATIONS

Derwent abstract of CN-101328018-A (Year: 2008).*

Aitken, et al. "The Pile-neutron Absorption Cross-Section of Samarium-149", J. Nuclear Energy I, 1957, vol. 4, pp. 33-37, Pergamon Press Ltd., London.

ATA, Applied Technology Associates, ARS-12A MHD Angular Rate Sensor, May 2012 (May 2012) [retrieved on May 24, 2012 (May 24, 2012)]. Retrieved from the internet:,URL:http://www.aptec.com/ATAWeb/ars12a_mhd_angular_rate_sensor.htm.

Barlow, et al. Radiation Hardness Measurements of New Permanent Magnet Materials for High-Intensity Linac Applications. Los Alamos National Laboratory, LA-UR-97-3370. Technical Report, Dec. 31, 1998. 10 pages.

Enriched Uranium [retrieved on Feb. 5, 2013 (Feb. 5, 2013)]. Retrieved from the internet:,URL:http://en.wikipedia.org/wiki/Enriched_Uranium.

ATA, Applied Technology Associates, Magnetohydrodynamic (MHD) Sensors, May 2012 (May 2012) [retrieved on May 24, 2012 (May 24, 2012)]. Retrieved from the internet:,URL:http://www.aptec.com/ATAWeb/application_notes_magnetohydrodynamics_mhd_sensors.

Request for Information (RFI), Air Force Research Laboratory Space Vehicles Directorate (AFRL/RVKV), Radiation Hardened Inertial Measurement Unit, Jan. 9, 2012. 6 pages.

Samarium Ionization Energy [retrieved on Feb. 5, 2013 (Feb. 5, 2013)]. Retrieved from the internet:,URL:http://samarium.atomistry.com/energy/html.

Topic S3, Spacecraft and Platform Subsystems, 2012 (2012) [retrieved on Jan. 18, 2013 (Jan. 18, 2013)]. Retrieved from the internet:,URL:http://sbir.nasa.gov/SBIR/sbirsttr2012/solicitation/SBIR/TOPIC_S3.html.

Uranium Ionization Energy [retrieved on Feb. 5, 2013 (Feb. 5, 2013)]. Retrieved from the internet:,URL:http://uranium.atomistry.com/energy.html.

Boron, retrieved on Jul. 30, 2012 (Jul. 30, 2012)]. Retrieved from the internet:,URL:http://en.wikipedia.org/wiki/Boron. pp. 1-15.

Subramanian, et al., "Development of Boron-based materials for nuclear applications". Technology Development Article. BARC newsletter. Issue No. 313, Mar.-Apr. 2010. pp. 14-21.

Technical data for Boron, [retrieved on Jul. 30, 2012 (Jul. 30, 2012)]. Retrieved from the internet:,URL:http://www.periodictable.com/Elements/005/data.html. pp. 1-3.

Technical data for Samarium [retrieved on Jul. 30, 2012 (Jul. 30, 2012)]. Retrieved from the internet:,URL:http://www.periodictable.com/Elements/062/data.html. pp. 1-3.

Turro, Influence of nuclear spin on chemical reactions: Magnetic isotope and magnetic field effects (A Review). Proc. Natl. Acad. Sci. USA. Nov. 1, 1982. pp. 609-621.

\* cited by examiner

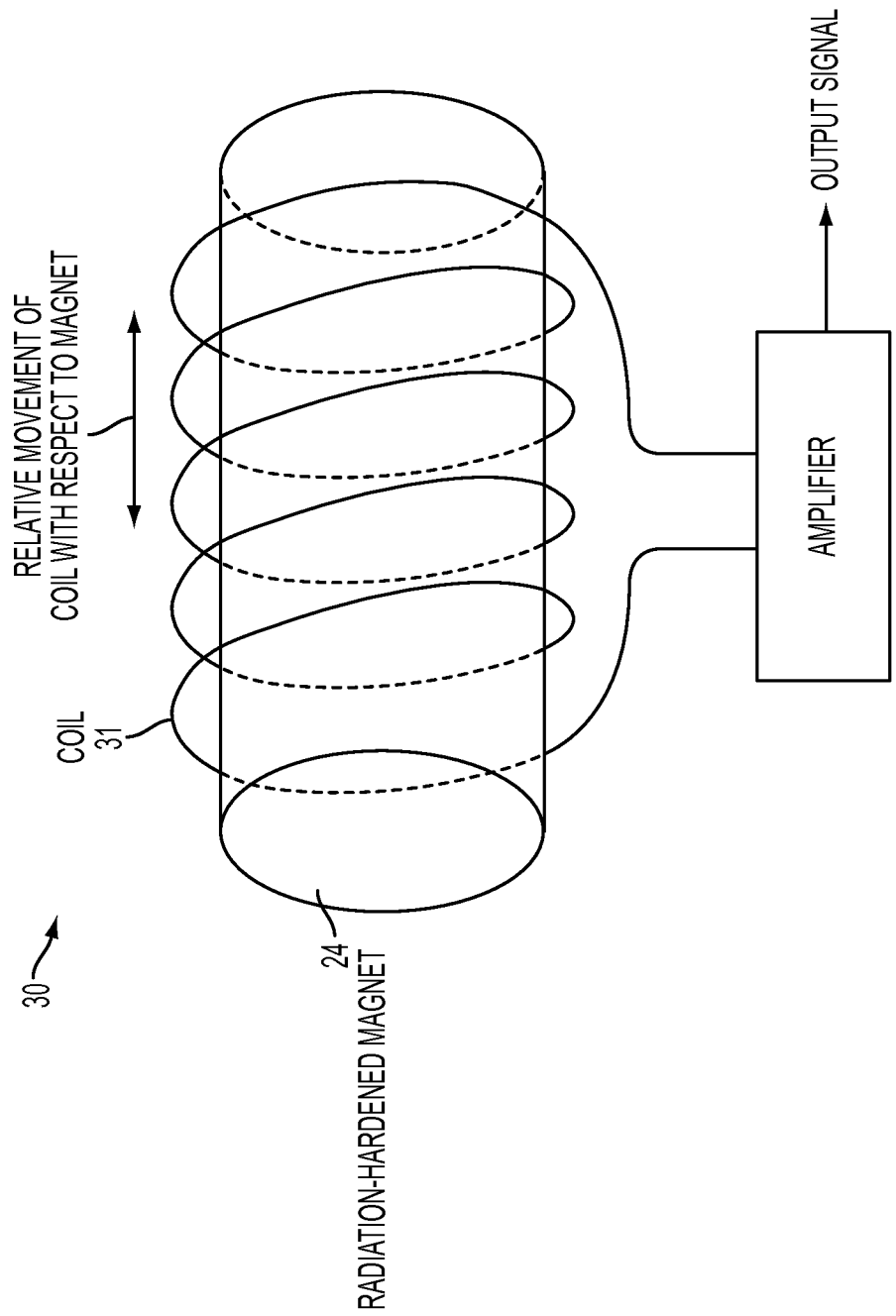

ISOTOPE ENRICHMENT FOR IMPROVED MAGNETIC MATERIALS

BACKGROUND

The present disclosure relates generally to improved magnetic materials and, more particularly, to improved magnetic materials that withstand a high radiation environment.

Current nuclear power generation facilities generate electricity by first generating steam using energy from a nuclear fission process. The steam then powers a steam turbine coupled to an electric generator. The steam turbine converts the energy of the steam into rotational energy, which is then converted to electricity by the generator. Unfortunately, the nuclear fission process also generates high radiation that can include neutrons, gamma rays, alpha particles, and beta particles. Equipment exposed to high radiation must be able to withstand the type of radiation it is exposed to by operating within its design specifications in order for the facilities to meet their design basis standards and to decrease maintenance costs.

Many applications for magnets exist in nuclear power facilities. One type of application is for sensors to detect or measure a physical property of nuclear power generating equipment. For example, a magnetohydrodynamic rate sensor may be used to sense angular rate and angular acceleration by measuring a relative velocity difference between a conductive fluid proof mass and a normally applied static magnetic field. A permanent magnet is used to generate the static magnetic field. In addition to nuclear power facilities, the magnetohydrodynamic rate sensor may be used for line-of-sight imaging platform stabilization in space based optical systems, which may also be exposed to high radiation in space. Because magnets in these applications may have their magnetic properties altered by a high radiation environment, there is a long standing need to improve magnetic materials so that their magnetic properties do not significantly change in these environments.

SUMMARY

Disclosed is a method for producing a magnetic material. The method includes: selecting a mixture of isotopes of a chemical element having a desired magnetic characteristic; identifying an isotope in the mixture of isotopes meeting a selection criterion; removing the identified isotope from the mixture of isotopes using an isotope separation device to produce an enriched mixture of isotopes having a decreased concentration of the identified isotope; wherein the enriched mixture of isotopes is the magnetic material.

Also disclosed is a magnet having a desired magnetic characteristic, the magnet includes a mixture of isotopes of a chemical element, wherein a concentration of at least one isotope in the plurality of isotopes is reduced from a natural abundance of that at least one isotope.

Further disclosed is a radiation-hardened sensor for sensing a property, the sensor includes: a magnet configured to provide a magnetic field for sensing the property, the magnet includes a mixture of isotopes of a chemical element, wherein a concentration of at least one isotope in the mixture of isotopes is reduced from a natural abundance of that at least one isotope.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIG. 4 depicts aspects of a transducer having a radiation-hardened magnet for sensing acoustic waves or vibrations;

DETAILED DESCRIPTION

Figure 1:
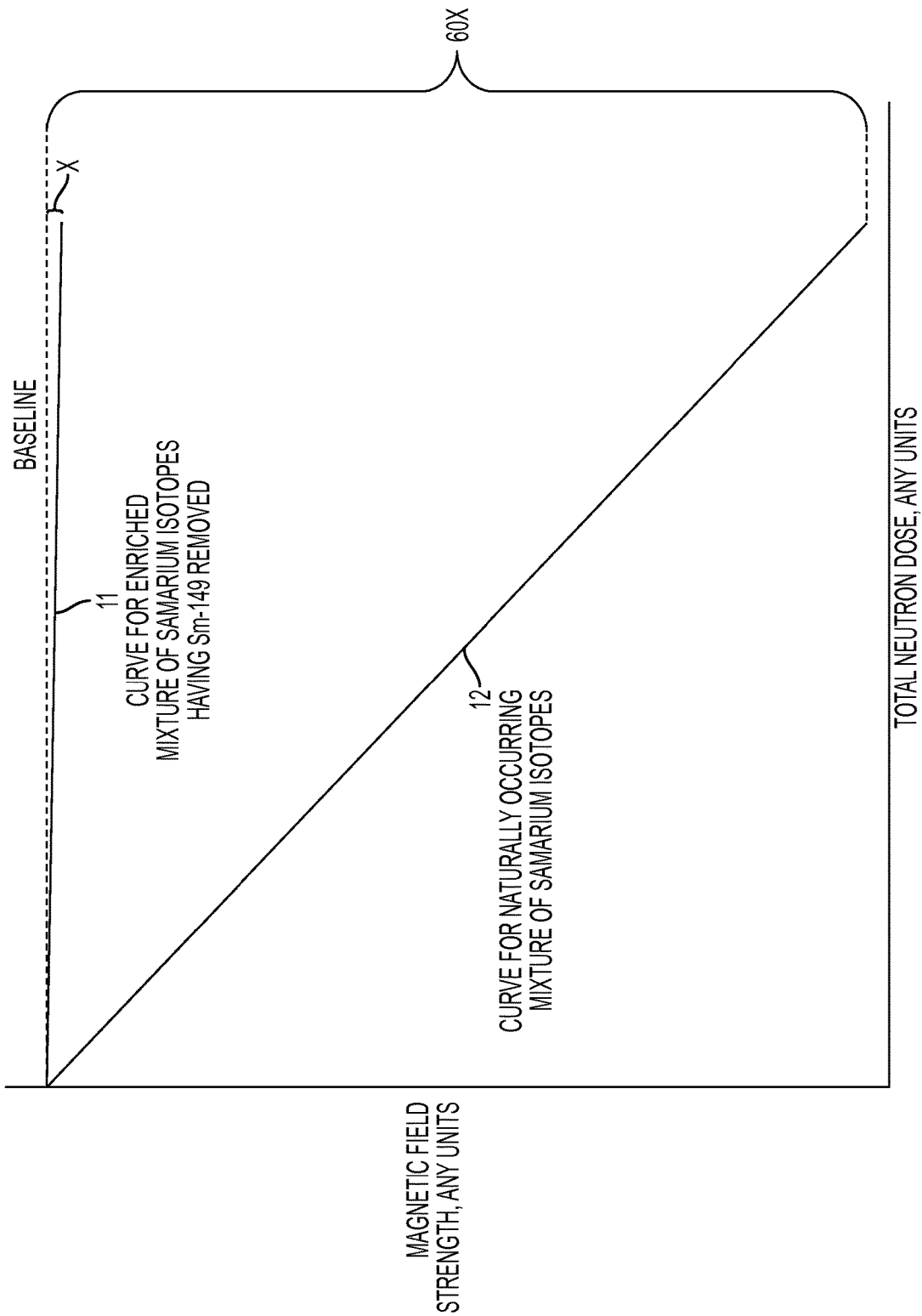
FIG. 1 illustrates magnetic strength decay curves for an enriched mixture of Samarium isotopes and a naturally occurring mixture of Samarium isotopes resulting from exposure to radiation.

A detailed description of one or more embodiments of the disclosed apparatus and method is presented herein by way of exemplification and not limitation with reference to the Figures.

Disclosed are techniques for producing radiation-hardened magnetic material. The term "radiation-hardened" relates to a magnetic material that maintains a selected magnetic property within a desired range after being exposed to a known dose or dose rate of radiation. This magnetic material may be used to fabricate a radiation-hardened magnet. Further, the radiation-hardened magnet may be used in a sensor to create a radiation-hardened sensor.

Ferromagnetic materials are generally used to make a permanent magnet because these materials retain a level of magnetization after they are magnetized. Two of many parameters that may be used to characterize permanent magnet material are remanence (residual magnet field after magnetization) and coercivity (resistance to demagnetization). Hence, permanent magnet materials are selected to have acceptable levels of remanence and coercivity for a particular application.

Some ferromagnetic materials may be composed of a mixture of isotopes of a chemical element. In general, these isotopes are naturally found in nature such that when the element is mined, the isotopes are found in certain ratios or proportions according to the natural abundance of these isotopes. For example, samarium has at least seven naturally occurring stable isotopes that are presented in Table 1 along with their natural abundance, their half-lives, and some of their cross-sections ($\sigma$) for absorbing a neutron in their nucleus. The neutron absorption cross-section of an isotope relates the probability or likelihood that the nucleus of the isotope will undergo a nuclear reaction that absorbs a neutron and, thus, transform the isotope to a different isotope, which may be stable or unstable. The nuclear reaction generally produces radiation as a product of the reaction. As a whole, the naturally occurring mixture of isotopes of Samarium has a cross-section of about 5900 barns.

TABLE 1

| Isotope | Natural Abundance | Half-Life, years | Cross-Section, barns |
| --- | --- | --- | --- |
| Sm-144 | 3.07% | Stable | |
| Sm-147 | 14.99% | $1.06 \times 10^{11}$ | |
| Sm-148 | 11.24% | $7 \times 10^{15}$ | |
| Sm-149 | 13.82% | Stable | 41,000 |
| Sm-150 | 7.38% | Stable | 100 |
| Sm-152 | 26.75% | Stable | 100 |
| Sm-154 | 22.75% | Stable | |

Because Sm-149 has a relatively high cross-section for neutron absorption, Sm-149 will undergo relatively more neutron absorption reactions than the other Samarium isotopes when exposed to a neutron flux resulting in a change in the concentration of Samarium isotope constituents in the isotope mixture. In addition, radiation such as alpha radiation will be produced as a byproduct of the nuclear reaction resulting from Sm-149 absorbing a neutron. This byproduct radiation can cause a loss of magnetization in the natural Samarium isotope mixture by disrupting magnetic domains of the various Samarium isotopes. The term "disrupting" relates to altering one or more magnetic domains such as by reversing or changing the direction of magnetization of the magnetic domain resulting in a loss or change in direction of magnetization and, thus, a loss or change in magnetic field strength or direction of the magnet.

In general, high energy particle scattering can cause a loss of magnetization in a permanent magnet material by a single high energy particle interaction that causes an entire magnetic domain, which can contain several million atoms, to reverse its direction. The remanence appears to suffer most from exposure to radiation although the coercivity may also be affected. Non-limiting embodiments of a magnetic property affected by exposure of an isotope mixture to a neutron flux may include level of magnetization maintained by a ferromagnetic material, level of magnetization maintained by a diamagnetic material, and time to magnetization after being exposed to a magnetic field of known strength.

In order to maintain a desired magnetic property of a mixture of isotopes that will be exposed to a neutron flux, the teachings disclosed herein call for removing a quantity or percentage of one or more isotopes in the mixture that are most affected by exposure to the neutron flux. After removal of the one or more isotopes, the resulting isotope mixture will be enriched with concentrations of isotopes that are less affected by exposure to the neutron flux. Hence, a magnetic property of the enriched elemental isotope mixture will be less affected or altered when the enriched isotope mixture is exposed to the neutron flux. In one or more embodiments, the one or more isotopes removed are selected to be isotopes with the highest cross-section value for neutron absorption, since these isotopes will be more likely to be affected by the neutron flux and, thus, emit more byproduct radiation that can later magnetic domains. Further separation of other isotopes may also be performed to remove isotopes having a next or second highest, third highest, etc., cross-section values for neutron absorption until a desired level or radiation-hardening is achieved.

Again using Samarium as an example, the naturally occurring mixture of Samarium isotopes has a neutron absorption cross-section of approximately 5900 barns. If all of the Samarium-149 is removed from the naturally occurring mixture, then the resulting neutron-absorption cross-section of the enriched mixture will be approximately 98 barns, which is about 60 times less than the cross-section of the naturally occurring mixture. Hence, a magnetic property of the enriched mixture of Samarium isotopes (i.e., with all Sm-149 removed) will be at least 60 times less affected than the same magnetic property in an equivalent amount of the naturally occurring mixture of Samarium isotopes as illustrated in FIG. 1. For the same amount of neutron radiation exposure and the same amount of magnetic material, curve 11 represents a decrease X in a magnetic field strength of the enriched mixture of Samarium isotopes (i.e., with all Sm-149 removed) and curve 12 represents a decrease of 60× in the magnetic field strength in the naturally occurring mixture of Samarium isotopes.

It can be appreciated that several types of radiation may be emitted at a nuclear power facility (or other facility having material or devices emitting radiation) such as neutrons, gamma-rays, alpha particles, or beta particles. While the above discussion relates to radiation-hardening of an isotope mixture against exposure to a neutron flux, the isotope mixture can also be hardened against the other types of radiation that may also cause a likely nuclear interaction that emits byproduct radiation that can alter magnetic domains in the magnetic material.

Figure 2:
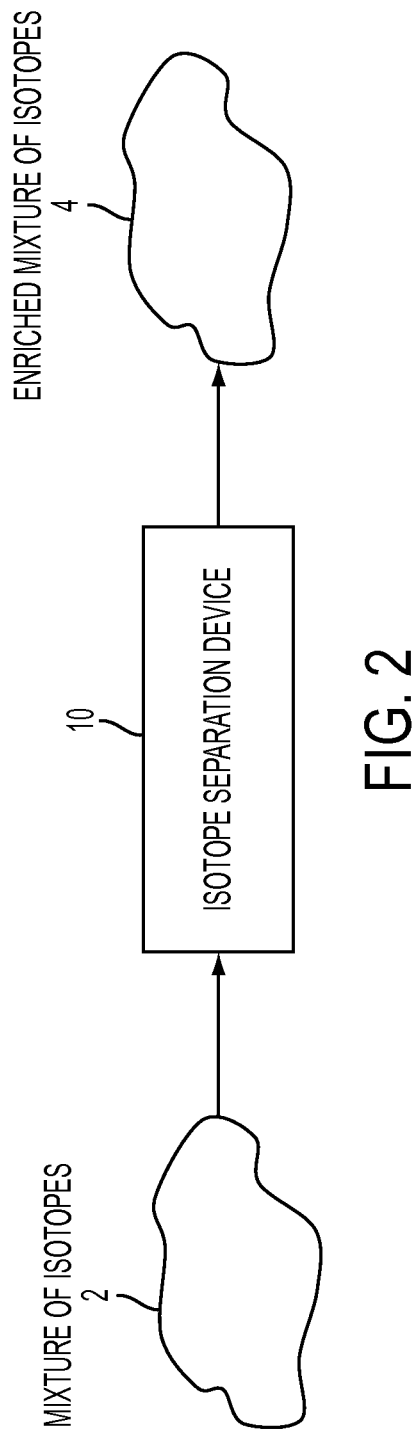
FIG. 2 illustrates an exemplary embodiment of an isotope separation device configured to separate one or more isotopes from a mixture of isotopes to produce an enriched isotope mixture.

FIG. 2 illustrates an exemplary embodiment of an isotope separation device 10 for enriching a mixture of isotopes 2. In general, one or more of the isotopes in the mixture of isotopes 2 has a desired magnetic property such as ferromagnetism, diamagnetism, or magnetization time for achieving a level of magnetization after being exposed to a magnetic field of a certain strength. In one or more embodiments, the mixture of isotopes 2 includes isotopes in concentrations that correlate with the abundance of those isotopes in nature (i.e., natural abundance). In one or more embodiments, the isotopes in the mixture of isotopes 2 are isotopes of only one chemical element.

The isotope separation device 10 is configured to enrich the mixture of isotopes 2 by removing or separating at least a portion of a selected isotope from that mixture of isotopes. An enriched mixture of isotopes 4 results from the isotope separation. The enriched mixture of isotopes 4 has a concentration of the selected isotope that is less than the concentration of that isotope in the mixture of isotopes 2. Magnetic isotopes can be separated by techniques that exploit the difference in (a) mass between isotopes or (b) electric charge to mass ratio (charge/mass) between isotopes.

Techniques that exploit the difference in mass include diffusion in the gaseous state, diffusion in liquid states, and centrifuge processes. Thus, the isotope separation device 10 in one or more embodiments may be a gaseous diffusion device, a liquid diffusion device, or a centrifuge device.

Techniques that exploit the difference in charge/mass include mass spectrometry, calutron, Dawson Isotope Separation Process, Advanced Vapor Laser Isotope Separation Process, Molecular Laser Isotope Separation Process, or emerging ultrashort pulse laser techniques. All of these techniques apply an electromagnetic field to ionized material and use the difference in the larmor radius (for magnetic fields) or velocity (for electric fields) to separate the ions and collect them when they impinge on a solid surface. Thus, the isotope separation device 10 in one or more embodiments may include apparatus that incorporates these techniques.

In one or more embodiments, the calutron may be used to separate isotopes of Samarium. Data for Calutron performance separating isotopes of uranium substantiates that this device can be used for Samarium isotope separation. The Calutron has successfully been used to separate U-235 from U-238. For singly charged ions, the difference in the charge/ mass is 3/238=1.3%. The ionization energy is controlled to prevent more than one ionization so that mostly singly charged atoms are produced to maximize the charge/mass difference. The calutron's measure of control can be quantified by comparing the first and second ionization energies of Uranium:

$U \rightarrow U^{1+} = 584$ kJ/mol; and $U^{1+} \rightarrow U^{2+} = 1420$ kJ/mol.

To prevent more than one ionization, the energy had to be greater than 584 kJ/mol, but less than 1420 kJ/mol.

The first and second ionization energies of Samarium are:

$Sm \rightarrow Sm^{1+} = 543.3$ kJ/mol;

$Sm^{1+} \rightarrow Sm^{2+} = 1068$ kJ/mol;

$Sm^{2+} \rightarrow Sm^{3+} = 2260$ kJ/mol; and $Sm^{3+} \rightarrow Sm^{4+} = 3990$ kJ/mol.

For successful separation, the energy has to be greater than 543 kJ/mol, but less than 1068 kJ/mol. These requirements for Samarium are nearly equal to the corresponding values for Uranium. Thus, the calutron is able to control the ionization of Samarium to produce the same fraction of singly charged ions as for Uranium.

The absorption cross section of naturally occurring samarium is 10,380 barns and that of samarium-149 is 74,500 barns. Samarium-149 is 13.82% of naturally occurring samarium and is the only significant contributor to the total thermal neutron cross section of naturally occurring Samarium. By assuming that the total thermal neutron cross-section is proportional to the sum of the products of the cross section of each of the individual isotopes times their naturally occurring percentage, it is estimated that the contribution to the total cross-section of the other naturally occurring samarium isotopes, X, is 98 barns. [74,500×0.1382]+X*(1−0.1382)=10,380. Solving for X, X=98. Thus, by completely removing the samarium-149 isotope, the total thermal neutron cross-section would decrease from 74,500 to 98 barns.

It is noted that naturally occurring samarium includes of isotopes 154, 152, 150, 149, 148, 147 and 144. For singly charged ions, the charge/mass ratio difference between 150 and 149 and 149 and 148 is only 0.7%. Thus, it is likely that 150, 149 and 148 isotopes will be depleted if a Calutron is used. Fortunately, samarium-150 is only 7.38% of naturally occurring samarium and 148 is only 11.24%. Hence, a Calutron process may result in Samarium having isotopes of 154, 152, 147 and 144 with the total thermal neutron cross-section decreased by a factor of up to 750.

Figure 3A:
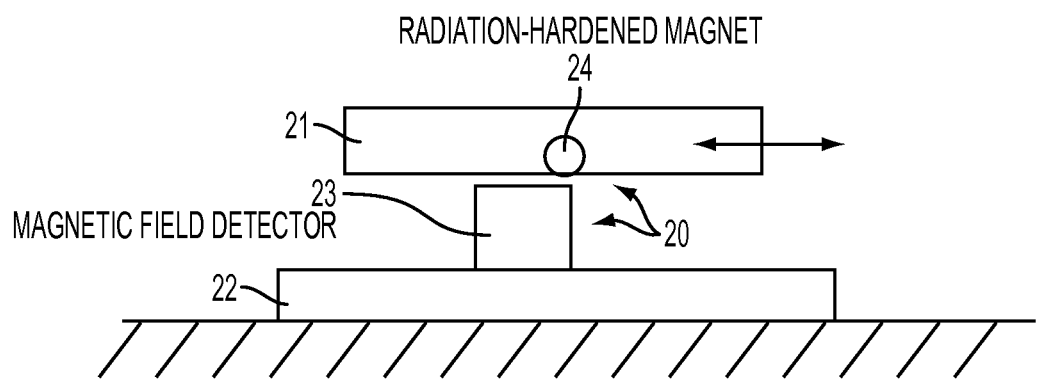
FIGS. 3A and 3B, collectively referred to as FIG. 3, depict aspects of noncontact sensors having a radiation-hardened magnet for sensing linear position and velocity, angular position, and rotational velocity.
Figure 3B:
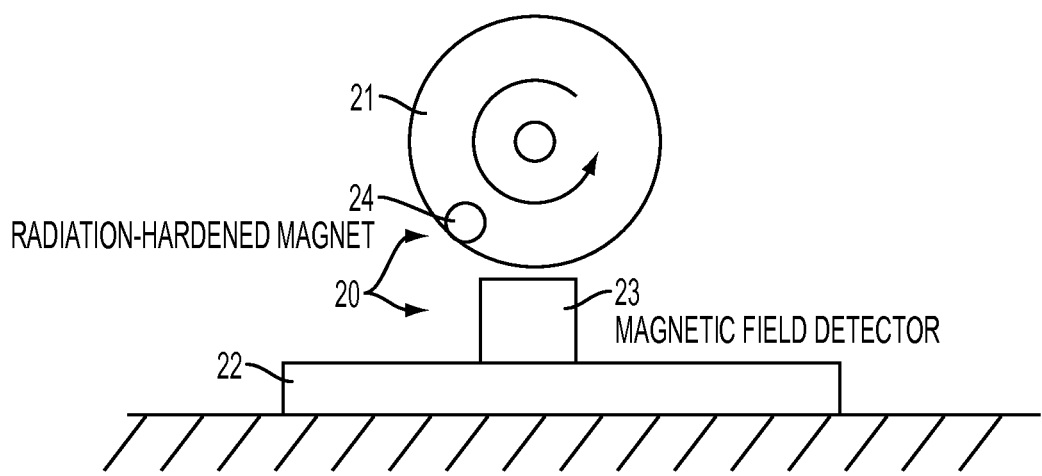

Reference may now be had to FIG. 3, which depicts aspects of a radiation-hardened sensor 20 configured to sense, detect, or measure a property of interest. The radiation-hardened sensor 20 includes a magnet 24 that is made from the enriched mixture of isotopes 4 in order for the magnet 24 to maintain a desired magnetic property during or after exposure to certain levels of radiation. Hence, the radiation-hardened sensor 20 can maintain its performance specifications during or after the exposure to the certain levels of radiation. One embodiment of the radiation-hardened sensor 20 configured for measuring linear position or velocity of a first component 21 relative to a second component 22 is illustrated in FIG. 3A. In the embodiment of FIG. 3A, the magnet 24 is secured to the first component 21 and a magnetic field detector 23 is secured to the second component 23. The magnetic field detector 23 is configured to detect or measure a magnetic field strength or magnetic field direction associated with the magnetic field established by the magnet 24. Accordingly, the magnetic field detector 23 can sense the magnetic field of the magnet 24 to measure the position of the first component 21 with respect to the second component 22. By differentiating the sensed position with respect to time, the velocity of the first component 21 with respect to the second component 22 can be calculated using an analog or digital processor. It can be appreciated that the magnet 24 in one or more embodiments may be secured to a float that is configured to float in a liquid that is in a tank or standpipe and that by sensing the position of the float, the liquid level in the tank may be obtained. In the embodiment of FIG. 3B, the magnet 24 is secured to a rotating first component 21 such as a rotor of an electrical motor and the magnetic field sensor 23 is secured to a stationary second component 22 such as a stator of the electrical motor. Hence, in this embodiment, the sensor 20 can sense the rotational position or velocity of the first component 21 with respect to the second component 22. When the sensor 20 is used on an electrical motor, the sensed position of the rotor can used as input to an electronic commutator controller for operating the motor. Other sensor applications requiring a magnet to maintain its magnetic property or properties in a radiation environment are also contemplated by this disclosure.

Reference may now be had to FIG. 4, which depicts aspects of a transducer 30. The transducer 30 is configured to convert movement such as acoustic waves or equipment vibration into an electrical signal. The transducer 30 includes a coil 31 (i.e., coil of wire or electrically conductive material) surrounding the magnet 24. The coil 31 is configured to intersect the magnetic field or flux lines of the magnet 24 so that movement between the coil 31 and the magnet 24 induces the electric signal in the coil 31. Either the coil 31 or the magnet 24 may be secured to a membrane for sensing (i.e., detecting or measuring) acoustic waves or to equipment in order to sense equipment vibrations for diagnostic purposes for example. The electrical signal output from the coil 31 may be amplified by an amplifier for further processing. It can be appreciated that the transducer 30 may be calibrated to provide the high accuracy required for certain applications. Use of the radiation-hardened magnet 24 will help to insure that a magnetic property of the magnet 24 will remain within a specified range during or after exposure to radiation. Accordingly, the transducer 30 will maintain calibration in the radiation environment and prevent degradation, which may require maintenance personnel to work in the radiation environment.

Figure 5:
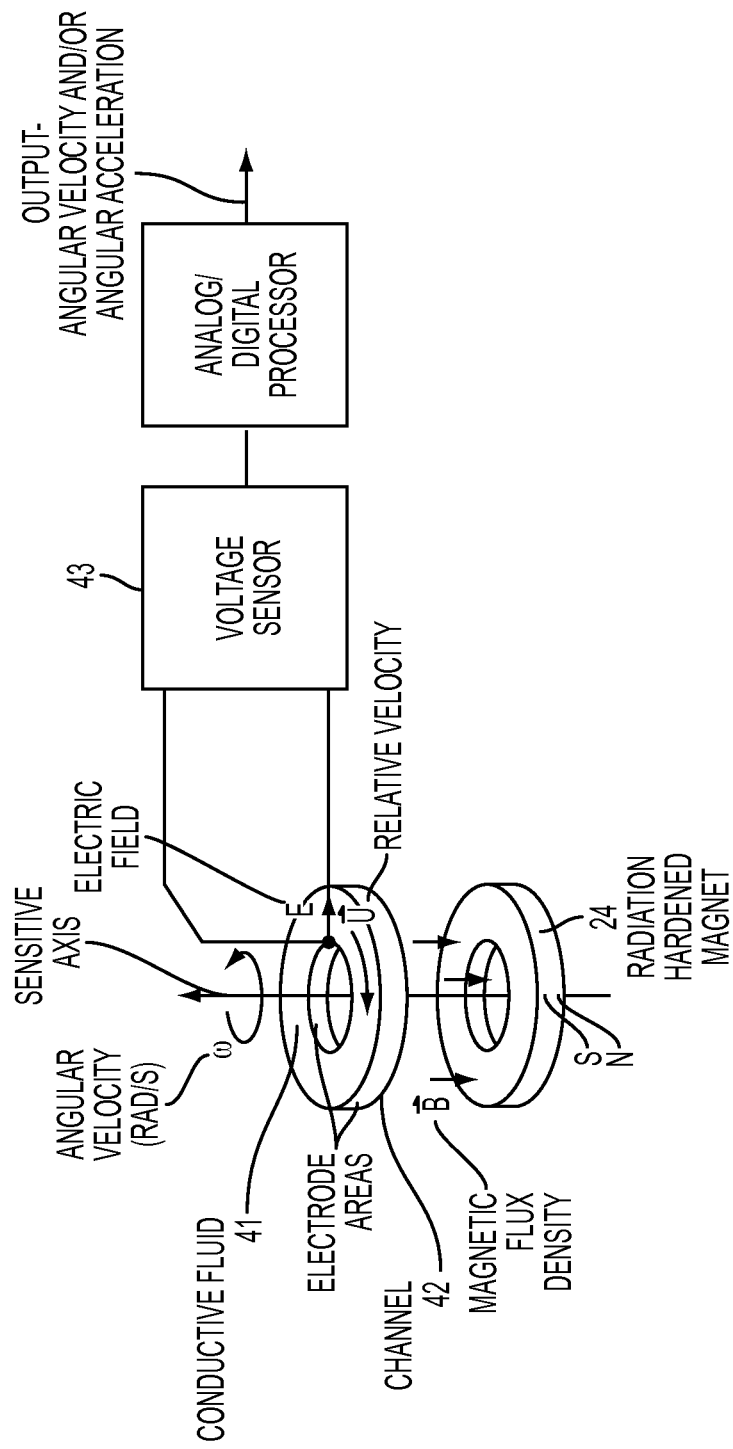
FIG. 5 depicts aspects of a magnetohydrodynamic sensor having a radiation-hardened magnet for sensing angular rate or angular acceleration.

Reference may be had to FIG. 5, which depicts aspects of a magnetohydrodynamic sensor 40. The magnetohydrodynamic (MHD) sensor 40 is configured to sense angular rotational rate or angular rotational acceleration. The MHD sensor 40 includes the radiation-hardened magnet 24 and a conductive fluid proof-mass 40 contained in a channel 42. Angular motion about the sensitive axis of the sensor 40 causes a relative angular motion or velocity difference between the conductive fluid proof-mass 41 and a magnetic field generated by the magnet 24. The magnetic field is applied normal or perpendicular to the plane of angular motion of the conductive fluid proof-mass 41. The relative motion or velocity difference between the conductive fluid proof-mass 41 and the normally applied magnetic field generates an electric potential between a first electrode coupled to an interior section of the circular channel 42 and a second electrode coupled to an exterior section of the circular channel 42. A voltage sensor 43 is coupled to the electrodes and is configured to measure the generated electric potential. The measured electric potential can be correlated to the angular rate or angular acceleration of the MHD sensor 40 by an analog or digital processor. The accuracy of the MHD sensor depends on the magnitude of the magnetic field remaining constant or within a certain range. The use of the radiation-hardened magnet 24 provides a magnetic field that maintains its magnitude within certain levels during and after exposure to certain levels of radiation. Hence, the accuracy of the MHD sensor 40 can be maintained during and after exposure the certain levels of radiation.

Figure 6:
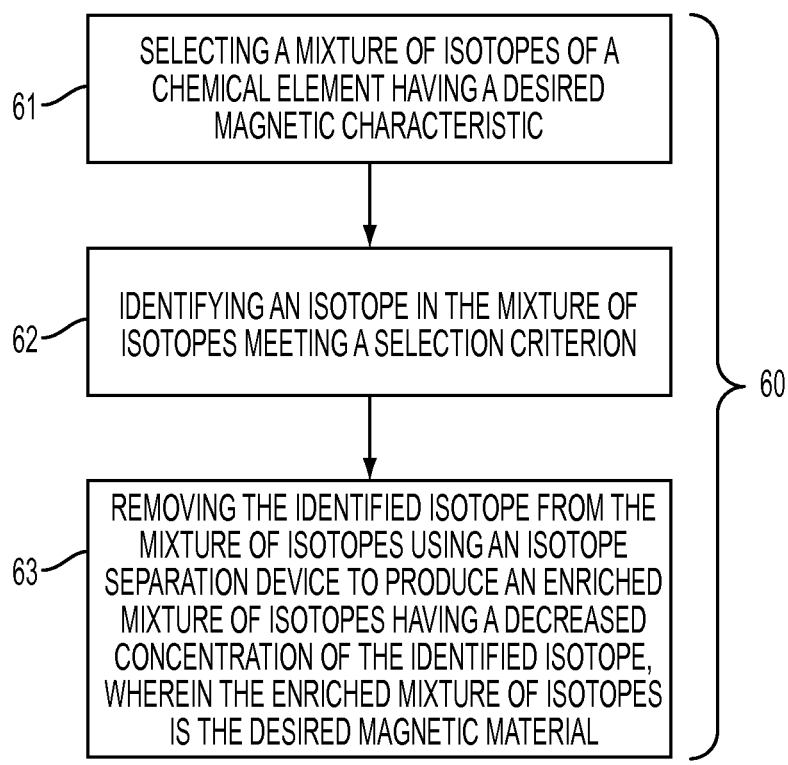
FIG. 6 is a flow chart of a method for producing a radiation-hardened magnetic material with stable magnetic properties in accordance with an exemplary embodiment.

FIG. 6 is a flow chart of a method 60 for producing a magnetic material. Block 61 calls for selecting a mixture of isotopes of a chemical element having a desired magnetic characteristic. The chemical element can represent only one chemical element or a plurality of chemical elements. Block 62 calls for identifying an isotope in the mixture of isotopes meeting a selection criterion. In one or more embodiments, the selection criterion is related to a cross-section for a type of nuclear reaction based on an interaction with a type of radiation such as neutron absorption. In one or more embodiments, the identified isotope has a highest cross-section for a selected type of nuclear reaction compared to the cross-sections of the other isotopes in the mixture of isotopes. Further, other isotopes having cross-sections above a threshold can also be identified. Block 63 calls for removing at least a portion of the identified isotope(s) from the mixture of isotopes using an isotope separation device to produce an enriched mixture of isotopes having a decreased concentration of the identified isotope. The resulting enriched magnetic material is then used as the desired magnetic material. In one or more embodiments, the magnetic material is then formed into a magnet that is radiation-hardened. In one or more embodiments, the radiation-hardened magnet is disposed in an apparatus to fabricate a radiation-hardened sensor.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list or string of at least two terms is intended to mean any term or combination of terms. The term "secure" relates to one component being coupled either directly to another component or indirectly to the another component via one or more intermediate components.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A method for producing a magnetic material that maintains a selected magnetic field strength after being exposed to a radiation, the method comprising:
    selecting a mixture of isotopes of a chemical element having a desired magnetic characteristic;
    identifying an isotope in the mixture of isotopes meeting a selection criterion, wherein the selection criterion comprises the isotope reacting to the radiation to produce a byproduct that causes loss of magnetization of the mixture of isotopes;
    removing the identified isotope from the mixture of isotopes using an isotope separation device to produce an enriched mixture of isotopes having a decreased concentration of the identified isotope;
    wherein the enriched mixture of isotopes is the magnetic material that maintains the selected magnetic field strength after being exposed to the radiation.

2. The method according to claim 1, wherein the chemical element is only one chemical element.

3. The method according to claim 1, wherein the desired magnetic characteristic is ferromagnetism.

4. The method according to claim 1, wherein the desired magnetic characteristic is diamagnetism.

5. The method according to claim 1, wherein the desired magnetic characteristic is magnetization time comprising a time for the magnetic material to be magnetized to a selected magnetization when exposed to a magnetic field of a selected strength.

6. The method according to claim 1, wherein the selection criterion comprises a cross-section value for a type of nuclear reaction.

7. The method according to claim 6, wherein the type of nuclear reaction comprises neutron absorption.

8. The method according to claim 6, further comprising identifying another isotope in the plurality of isotopes having another selected cross-section value for a type of nuclear reaction and removing the another identified isotope from the mixture of isotopes.

9. The method according to claim 6, wherein the identified isotope is a first isotope having a highest cross-section value for the type of nuclear reaction compared to the other isotopes in the mixture of isotopes to produce a first enriched mixture of isotopes having a decreased concentration of the first isotope.

10. The method according to claim 9, further comprising identifying a second isotope having a second highest cross-section value for the type of nuclear reaction compared to the other isotopes in the mixture of isotopes and removing the second isotope from the mixture of isotopes using an isotope separation device to produce a second enriched mixture of isotopes having a decreased concentration of the first and second isotopes.

11. The method according to claim 6, further comprising fabricating a magnet from the magnetic material.

12. The method according to claim 11, further comprising disposing the magnet in an apparatus to produce in a sensor assembly.

13. The method according to claim 12, wherein the sensor assembly is configured to sense position or velocity of a first component relative to a second component or angular position or rotational velocity of a first component relative to a second component.

14. The method according to claim 1, wherein the radiation comprises neutrons.

15. The method according to claim 1, wherein the radiation comprises gamma rays.

16. The method according to claim 1, wherein the radiation comprises alpha particles.

17. The method according to claim 1, wherein the radiation comprises beta particles.

18. The method according to claim 1, wherein the isotope reacting to the radiation results in disrupting one or more magnetic domains in the mixture of isotopes.

19. A magnet comprising a desired magnetic characteristic, the magnet comprising a mixture of isotopes of a chemical element, wherein a concentration of at least one isotope which reacts to a radiation to produce a byproduct that causes loss of magnetization of the mixture of isotopes in the plurality of isotopes is reduced from a natural abundance of that at least one isotope to produce an enriched mixture of isotopes in the magnet;
    wherein the enriched mixture of isotopes is a magnetic material that maintains a selected magnetic field strength after being exposed to the radiation.

20. The magnet according to claim 19, wherein the at least one isotope meets a selection criterion, wherein the selection criterion comprises selecting for reduction in concentration the at least one isotope reacting to the radiation to produce a byproduct that causes loss of magnetization of the mixture of isotopes in the magnet.

21. The magnet according to claim 20, wherein the selection criterion is a cross-section value for a type of nuclear reaction.

22. The magnet according to claim 21, wherein the type of nuclear reaction comprises neutron absorption.

23. A radiation-hardened sensor for sensing a property, the sensor comprising: a magnet configured to provide a magnetic field for sensing the property, the magnet comprising a mixture of isotopes of a chemical element, wherein a concentration of at least one isotope in the mixture of isotopes is reduced from a natural abundance of that at least one isotope to produce an enriched mixture of isotopes in the magnet;
    wherein a selection criterion for the reduction of the concentration of at least one isotope comprises the at least one isotope reacting to a radiation to produce a byproduct that causes loss of magnetization of the mixture of isotopes;
    and wherein the enriched mixture of isotopes is a magnetic material that maintains a selected magnetic field strength after being exposed to the radiation.

24. The sensor according to claim 23, further comprising a magnetic field detector configured to detect or measure a magnetic field associated with the magnet in order to sense a position or velocity of first component with respect to a second component.

25. The sensor according to claim 23, further comprising (i) a coil of electrically conductive material for inducing an electrical signal from a change in the magnetic field in order to sense acoustic waves or vibration or (ii) a conductive fluid for inducing an electrical signal from relative motion between the and magnetic field and the conductive fluid in order to sense velocity or acceleration.

* * * * *